United States Patent [19]

van den berg et al.

[11] Patent Number: 4,758,451

[45] Date of Patent: Jul. 19, 1988

[54] PROCESS FOR PRODUCING COATED MOLDED BODIES

[75] Inventors: Henk van den berg; Udo König, both of Essen; Norbert Reiter, Mettmann, all of Fed. Rep. of Germany

[73] Assignee: Fried. Krupp GmbH, Essen, Fed. Rep. of Germany

[21] Appl. No.: 943,415

[22] Filed: Dec. 19, 1986

[30] Foreign Application Priority Data

Dec. 19, 1985 [DE] Fed. Rep. of Germany ....... 3544975

[51] Int. Cl.⁴ ...................... C23C 16/32; C23C 16/34; C23C 16/36
[52] U.S. Cl. ................................ 427/249; 427/255.2; 427/255.7; 427/419.7
[58] Field of Search ..................... 427/249, 255.2, 255, 427/255.7, 419.7

[56] References Cited

U.S. PATENT DOCUMENTS

| | | | |
|---|---|---|---|
| Re. 32,111 | 4/1986 | Lambert et al. | 428/699 |
| 3,642,522 | 2/1972 | Hintermann | 427/249 |
| 3,656,995 | 4/1972 | Reedy | 427/249 |
| 3,807,008 | 4/1974 | Reedy | 427/249 |
| 3,900,592 | 8/1975 | Kennedy et al. | 427/249 |
| 4,180,400 | 12/1979 | Smith et al. | 427/255.2 |
| 4,196,233 | 4/1980 | Bitzer et al. | 427/249 |
| 4,264,682 | 4/1981 | Fuyama et al. | 427/249 |
| 4,357,382 | 11/1982 | Lambert et al. | 428/698 |
| 4,623,400 | 11/1986 | Japka et al. | 427/255.2 |

FOREIGN PATENT DOCUMENTS 2113853  5/1973  Fed. Rep. of Germany ... 427/255.2

OTHER PUBLICATIONS

Powell et al, "Vapor Deposition", pp. 425–430 and 469.

*Primary Examiner*—Sadie L. Childs
*Attorney, Agent, or Firm*—Sughrue, Mion, Zinn, Macpeak & Seas

[57] ABSTRACT

A process for producing a coated molded body according to the CVD process, in which at least one layer of hard material, consisting of carbides, nitrides and/or carbonitrides of the elements titanium, zirconium, hafnium, niobium and/or tantalum is deposited on a metallic substrate from a reactive gas phase. The gas phase contains aluminium trichloride, aluminium tribromide or magnesium chloride in a molar ratio of from 0.1:1 to 5:1, with respect to the halide of titanium, zirconium, hafnium, niobium and/or tantalum which is in the gas phase.

8 Claims, 2 Drawing Sheets

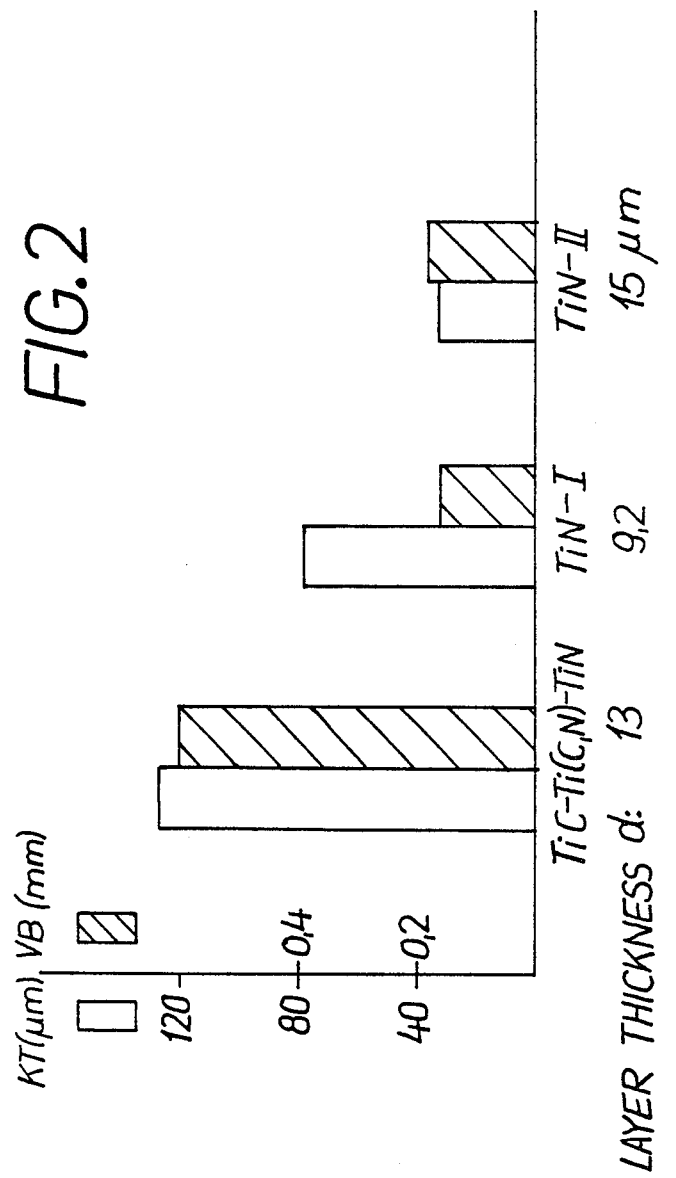

PROCESS FOR PRODUCING COATED MOLDED BODIES

BACKGROUND OF THE INVENTION

The present invention relates to a process for producing a coated molded body in which at least one layer of hard materia, comprising at least one carbide, nitride or carbonitride of at least one of the elements titanium, zirconium, hafnium, niobium and tantalum is deposited on a metallic substrate from a reactive gas phase, according to the chemical vapor deposition (CVD) process. Such molded bodies have good anti-wear properties. Thus, they are used, in particular, as tools for chip-producing and chipless shaping of metallic work pieces.

A molded body, comrprising ahard metal substate and at least one layer of hard metal, is known from Swiss Pat. No. 507 904, in which the hard metal substrate is composed of one or more hard materials and at least one binder metal and in which the layer of hard material contains hard carbides or nitrides. Such molded bodies may be used as tools for chip-producing and chipless shaping, since they have good anti-wear properties. The well-known molded bodies are produced according to the CVD process (chemical vapor deposition process), as described in the Swiss Pat. No. 452 205. In the CVD process, which currently belongs to the usable coating methods, a surface layer is deposited on a substrate from a reactive gas atmosphere, whose temperature usually ranges from 600° to 1200° C. The gas atmosphere contains several compounds, which react with one another at the reaction temperature and form the material which comprises the surface layer. For example, the general practice is to coat metallic substrates with layers of hard material, consisting of carbides, nitrides, or carbonitrides, whereby the gas atmosphere contains halides of the group III to VI elements of the periodic system and a nitrogen-containing compound and/or a carbon-containing compound. Thus, for example, a layer of titanium carbide is deposited on a hard metallic substrate from a gas atmosphere, which contains titanium tetrachloride and methane, at approximately 1000° C. Suitable carbon-containing compounds which can be used in the gas atmosphere generally are gaseous hydrocarbons, whereas suitable nitrogen-containing compounds may be $N_2$, $NH_3$, or amines.

It has been shown that the deposition of hard carbides, nitrides and carbonitrides on metallic substrates according to the CVD process requires quite a long reaction time, since the deposition speed is approximately 1 to 2 $\mu m/h$, and that the layers of hard material have too coarse a grain structure, which reduces their adhesion and resistance to wear. Since as a rule the layers of hard material should have a thickness, ranging from 8 to 12 $\mu m$, it is necessary that the layers of hard material have a fine grain structure.

SUMMARY OF THE INVENTION

It is a primary object of the present invention to provide a process for producing a coated molded body, which, on the one hand, requires less time for coating than the well-known CVD process, and which, on the other hand, yields layers of hard material that have a very fine grain structure.

Additonal objects and advantages of the present invention will be set forth in part in the description which follows and in part will be obvious from the description or can be learned by practice of the invention. The objects and advantages are achieved by means of the processes, instrumentalities and combinations particularly pointed out in the appended claims.

To achieve the foregoing objects and in accordance with its purpose, the present inventio provides a process for producing a coated molded body according to the CVD process, in which at least one layer of hard material, consisting of at least one carbide, nitride or carbonitride of at least one of the elements titanium, zirconium, hafnium, vanadium, niobium and tantalum is deposited on a metallic substrate from a reactive gas phase, the gas phase containing (a) at least one halide of at least one of the elements titanium, zirconium, hafnium, niobium and tantalum and (b) at least one compound which is a nitrogen-containing compound or a carbon-containing compound, the gas phase being free of oxygen and oxygen-containing compounds, comprising adding to the gas phase at least one compound selected from aluminum trichloride, aluminum tribromide or magnesium chloride in a molar ratio of from 0.1:1 to 5:1, with respect to the halide of titanium, zirconium, hafnium, niobium and tantalum.

That is, it has been shown surprisingly that the compounds aluminum trichloride, aluminum tribromide and magnesium chloride significantly increase the coating speed. In addition to this, the layers formed in the presence of these compounds have a very fine structure. The layers of hard material produced according to the process of the present invention have a high degree of adhesion and resistance to wear, which may be traced, in particular, to the fine granularity of the layers.

In a preferred embodiment of the present invention the metallic substrate consists of hard metal, for in this manner molded bodies that are especially resistant to wear and that are suitable for chip-forming processing of metallic work pieces can be produced.

In the practice of the present invention the CVD process preferably is carried out at a temperature of from 800° to 1100° C. In this temperature range the deposition process is influenced in a favorable manner, for even at low temperatures in this range the deposition speed is adequately high and at higher temperatures a fine grain structure is formed.

BRIEF DESCRIPTION OF THE DRAWINGS

FIG. 2 shows the result of tests to determine the cutting quality of a reversible cutting tip, which was coated according to the process of the present invention.

DETAILED DESCRIPTION OF THE INVENTION

Figure 1:
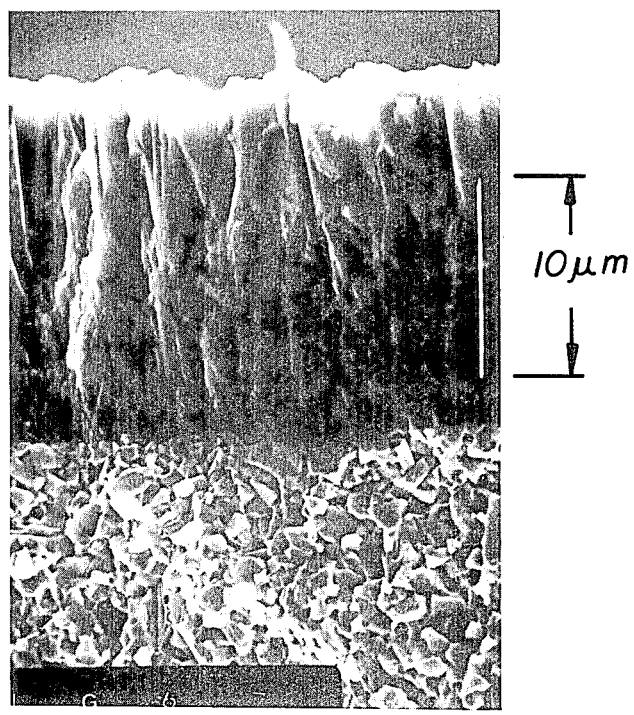
FIG. 1 shows a photograph of a fracture of a coated molded body, produced according to the process of the present invention.

The present invention is illustrated in detail by the following example.

A number of reversible cutting tips which were made of hard metal were used as substrates on which a hard material was deposited in accordance with the present invention. The hard metal reversible cutting tips had a composition of 82.5% W, 11% (Ti, Ta, Nb) C and 6.5% CO (percents by weight) and were placed in an electrically heated reaction container, made of heat resistant steel. These reversible cutting tips were heated to a temperature of 1005° C. in an inert gas atmosphere within a period of 90 minutes. After this temperature had been reached, the initial pressure of 100,000 Pascal was reduced to 50,000 Pascal, and a gas mixture, comprising 0.9% $TiCl_4$, 1.5% $AlCl_3$, 27% $N_2$ and 70.6% $H_2$ (atomic percent) was passed over the reversible cutting tips. After 165 minutes the deposition process was terminated, and the coated reversible cutting tips were cooled in a hydrogen atmosphere to room temperature. The layer of hard material which was deposited on the reversible cutting tips had a thickness, ranging up to 17 $\mu$m. which was quite amazing, since it is known from experience that under similar conditions, but without the addition of $AlCl_3$, only layers having a thickness of approximately 6 to 8 $\mu$m can be expected. The coating had a glistening gold coloration, which may be explained by the high quality of its surface finish.

One of the coated reversible cutting tips then was broken for the purpose of evalution, and the fracture was examined with a scanning electron microscope. The photographic drawing of this fracture (FIG. 1) shows that the layer of hard material consists of very dense, fine-grained material.

An x-ray diffraction examination showed that the material of the layer of hard material consists of polycrystalline titanium nitride, having a lattice constant of a $=0.4242$ nm. Other phases could not be identified. The micro hardness $HV_{0.05}$ (Vickers Hardness) of the layer of hard material ranged from 2200 to 2600. Even the test of the adhesion of the layer of hard material to the substrate yielded above average values. No aluminum could be detected within the detection limit of the equipment (smaller than 0.05% by mass of Al) by means of analysis with an electron microprobe and with an x-ray fluorescence apparatus. Even this result is surprising in light of the quantity of $AlCl_3$ added. All of the results show that the aluminum chloride has a positive catalytic influence on the deposition of titanium nitride. In the deposition process no aluminum is embedded in the titanium nitride layer. Upon leaving the reactor, the aluminum chloride is precipitated as aluminum oxide in a basic wash solution.

The process of the present invention is repeated several times, whereby the concentration of the aluminum chloride, the deposition temperature and the coating times are also changed. In all cases, it was observed that the deposition speed was accelerated as compared to what is to be expected under similar conditions, but without the addition of $AlCl_3$.

The reversible cutting tips, coated according to the process of the present invention, were subjected to comparison tests to determine the cutting quality by turning C6ON steel in a smooth cut. A commercial SNUN 120408 reversible cutting tip, which was coated with multiple layers, comprised of titanium carbide, titanium carbonintride and titanium nitride and being 13 $\mu$m thick in total, was used as a standard for comparison. The coating time of the reversible cutting tip, used for comparison, was 300 minutes. Reversible cutting tips, coated in such a manner, are used to a large degree in the machine tool industry for cutting iron materials at average to high cutting speeds and large cutting cross-sections. The result of these tests to determine the cutting quality is shown in FIG. 2. In order to evaluate the resistance to wear, the crater wear KT and the tool flank wear VB were determined after machining. The machining of C6ON steel was done under the following conditions:

Rotational speed $t_c=10$ minutes,
Cutting speed $v_c=220$ m/min,
Cutting cross-section $a_p x f = 1.5 \times 0.28$ mm²/revolution In the comparison tests, two reversible cutting tips coated according to the present invention were employed. The two reversible cutting tips coated according to the present invention are referred to herein as TiN-I which had a coating thickness of 9.2 $\mu$m and TiN-II which had a coating thickness of 15 $\mu$m.

Despite the layer's smaller thickness of 9.2 $\mu$m, the TiN-I reversible cutting tip coated according to the process of the present invention, has a considerably lower crater and tool flank wear than the reversible cutting tip, coated with a 13 $\mu$m thick TiC-Ti (C, N)-TiN-coating and belonging to the state of the art. The good characteristic values for wear, shown by the TiN-I reversible cutting tip coated according to the process of the present invention, are even surpassed by the TiN-II reversible cutting tip produced according to the process of the present invention. Its layer of hard material is 15 $\mu$m thick.

It was found in other tests that the addition of $AlCl_3$ also has a catalytic effect when layers of titanium carbide and titanium carbonitride, as well as layers of zirconium nitride, are deposited. With respect to the growth speed, the largest effects were determined with the deposition of nitrides and nitrogen-rich carbonitrides. As with $AlCl_3$, the use of aluminum tribromide and magnesium chloride in the gas phase caused an increase in the growth speed when layers of carbide, carbonitride and nitride layers were deposited.

It will be understood that the above description of the present invention is susceptible to various modifications, changes and adaptations, and the same are intended to be comprehended within the meaning and range of equivalents of the appended claims.

What is claimed is:

1. A process for producing a coated molded body according to the chemical vapor deposition (CVD) process, in which at least one layer of hard material, consisting of at least one carbide, nitride or carbonitride of at least one of the elements titanium, zirconium, hafnium, niobium and tantalum is deposited on a metallic substrate from a reactive gas phase, the gas phase containing at least one halide of at least one of the elements titanium, zirconium, hafnium, niobium, and tantalum, and at least one compound which is a nitrogen-containing compound or a carbon-containing compound, the gas phase being free of oxygen and oxygen-containing compounds, comprising adding to the gas phase at least one compound selected from aluminium trichloride, aluminium tribromide or magnesium chloride in molar ratio, of from 0.1:1 to 5:1, with respect to the halide of titanium, zirconium, hafnium, niobium and tantalum.

2. Process as claimed in claim 1, wherein the metallic substrate consists of hard metal.

3. Process as claimed in claim 1, wherein the CVD process is carried out at 800° to 1100° C.

4. Process as claimed in claim 2, wherein the CVD process is carried out at 800° to 1100° C.

5. Process as claimed in claim 1, wherein the compound added to the gas phase is aluminum trichloride.

6. Process as claimed in claim 2, wherein the compound added to the gas phase is aluminum trichloride.

7. Process as claimed in claim 3, wherein the compound added to the gas phase is aluminum trichloride.

8. Process as claimed in claim 4, wherein the compound added to the gas phase is aluminum trichloride.

* * * * *